(12) United States Patent
Schiffer et al.

(10) Patent No.: US 11,846,678 B2
(45) Date of Patent: Dec. 19, 2023

(54) METHOD AND SYSTEM FOR VALIDATING A TEMPERATURE SENSOR IN A BATTERY CELL

(71) Applicant: Samsung SDI Co., Ltd., Yongin-si (KR)

(72) Inventors: Adrian Schiffer, Vienna (AT); Peter Parz, Gratwein (AT)

(73) Assignee: Samsung SDI Co., Ltd., Gyeonggi-do (KR)

( * ) Notice: Subject to any disclaimer, the term of this patent is extended or adjusted under 35 U.S.C. 154(b) by 522 days.

(21) Appl. No.: 16/432,178

(22) Filed: Jun. 5, 2019

(65) Prior Publication Data

US 2019/0379092 A1 Dec. 12, 2019

(30) Foreign Application Priority Data

Jun. 7, 2018 (EP) .................................... 18176431
May 27, 2019 (KR) ........................ 10-2019-0062128

(51) Int. Cl.
  *H01M 10/48* (2006.01)
  *H01M 10/42* (2006.01)
  *G01R 31/3835* (2019.01)

(52) U.S. Cl.
  CPC ...... *G01R 31/3835* (2019.01); *H01M 10/425* (2013.01); *H01M 10/4207* (2013.01); *H01M 10/486* (2013.01); *H01M 2200/10* (2013.01)

(58) Field of Classification Search
  CPC ............. H01M 10/486; H01M 10/425; H01M 10/4207; H01M 2200/10; G01R 31/3835; G01R 31/367; G01R 31/389; Y02E 60/10
  See application file for complete search history.

(56) References Cited

U.S. PATENT DOCUMENTS

2006/0001429 A1* 1/2006 Huang ................. G01R 31/389
                                                     324/426
2007/0001679 A1   1/2007 Cho et al.
                  (Continued)

FOREIGN PATENT DOCUMENTS

CN   204030697 U   12/2014
EP     2720055 A2   4/2014
                  (Continued)

OTHER PUBLICATIONS

Machine translation of WO 2013/031558, Hamamoto, 2013 (Year: 2013).*

(Continued)

*Primary Examiner* — Kwang Han
(74) *Attorney, Agent, or Firm* — Knobbe, Martens, Olson & Bear, LLP

(57) ABSTRACT

A method and a system for validating a temperature sensor integrated into a battery system are disclosed. In one aspect, the method includes determining an internal resistance of at least one battery cell in thermal contact with the temperature sensor and determining a state of charge (SOC) of the at least one battery cell. The method also includes determining at least one reference temperature from a lookup table (LUT) or a functional relationship connecting the internal resistance, the SOC, and a temperature of a reference battery cell. The method further includes comparing the at least one reference temperature with at least one temperature measurement of the temperature sensor to determine a difference therebetween. The method additionally includes validating the temperature sensor based on whether the difference exceeds a preconfigured threshold.

14 Claims, 6 Drawing Sheets

(56) References Cited

U.S. PATENT DOCUMENTS

| | | | |
|---|---|---|---|
| 2008/0234956 | A1 | 9/2008 | Mizuno et al. |
| 2011/0172939 | A1 | 7/2011 | Uprety et al. |
| 2012/0130661 | A1 | 5/2012 | Hagimori et al. |
| 2012/0256569 | A1* | 10/2012 | Kawahara ............ H01M 10/613 374/142 |
| 2012/0265462 | A1 | 10/2012 | Iwane et al. |
| 2013/0080096 | A1 | 3/2013 | Toki |
| 2014/0139149 | A1 | 5/2014 | Hayashida et al. |
| 2017/0214256 | A1* | 7/2017 | Hardy ............... H02J 7/007182 |
| 2018/0233786 | A1* | 8/2018 | Schwichtenhovel . H01M 10/48 |

FOREIGN PATENT DOCUMENTS

| | | | |
|---|---|---|---|
| EP | 3121613 A1 | | 1/2017 |
| KR | 10-1518915 B1 | | 5/2015 |
| KR | 10-1776840 B1 | | 9/2017 |
| KR | 10-1786900 B1 | | 10/2017 |
| WO | WO 2013/031558 | * | 3/2013 ............ G01R 31/392 |

OTHER PUBLICATIONS

Examination Report dated May 14, 2021 in corresponding European patent application No. 18176431.7, 8 pp.

Ablay, Gunyaz, "An Observer-Based Fault Diagnosis in Battery Systems of Hybrid Vehicles," 2013 8th International Conference on Electrical and Electronics Engineering (ELECO), The Chamber of Turkish Electrical Engineers-Bursa (Nov. 28, 2013) pp. 238-242.

El Mejdoubi et al., "State-of-Charge and State-of-Health Lithium-Ion Batteries' Diagnosis According to Surface Temperature Variation," IEEE Transactions on Industrial Electronics (Apr. 2016) vol. 63, No. 4, pp. 2391-2402.

Huria et al., "High Fidelity Electrical Model with Thermal Dependence for Characterization and Simulation of High Power Lithium Battery Cells," Electric Vehicle Conference (IEVC), 2012 IEEE International, (Mar. 4, 2012), pp. 1-8.

Moshirvaziri et al., "Modelling of Temperature Dependent Impedance in Lithium Ion Polymer Batteries and Impact Analysis on Electric Vehicles," IECON 2014—40th Annual Conference of the IEEE Industrial Electronics Society, IEEE (Oct. 29, 2014) pp. 3149-3155.

Xiong et al., "Review on Sensors Fault Diagnosis and Fault-Tolerant Techniques for Lithium Ion Batteries in Electric Vehicles", Electronics and Applications (ICIEA), IEEE (May 31, 2018), pp. 406-410.

Extended European Search Report dated Jan. 7, 2019 for European Patent Application No. EP 18 176 431.7.

* cited by examiner

METHOD AND SYSTEM FOR VALIDATING A TEMPERATURE SENSOR IN A BATTERY CELL

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The described technology generally relates to a method and system for validating a temperature sensor integrated into a battery system, more particularly for validating a temperature measurement of that temperature sensor.

Description of the Related Technology

A rechargeable or secondary battery differs from a primary battery in that it can be repeatedly charged and discharged, while the latter provides only an irreversible conversion of chemical to electrical energy. Low-capacity rechargeable batteries are used as power supply for small electronic devices, such as smartphones, laptops, tablets, and camcorders, while high-capacity rechargeable batteries are generally used as the power supply for hybrid vehicles and home batteries.

In general, rechargeable batteries include an electrode assembly including a positive electrode, a negative electrode, and a separator interposed between the positive and negative electrodes, a case receiving the electrode assembly, and an electrode terminal electrically connected to the electrode assembly. An electrolyte solution is injected into the case in order to enable charging and discharging of the battery via an electrochemical reaction of the positive electrode, the negative electrode, and the electrolyte solution. The shape of the case, e.g., cylindrical or rectangular, depends on the battery's intended purpose.

Rechargeable batteries may be used as a battery module including multiple unit battery cells coupled in series and/or in parallel so as to provide a high energy density, e.g., for motor driving of a hybrid vehicle. That is, the battery module is formed by interconnecting the electrode terminals of the unit battery cells depending on a required amount of power and in order to realize a high-power rechargeable battery, e.g., for an electric vehicle.

SUMMARY OF CERTAIN INVENTIVE ASPECTS

One inventive aspect is a battery system comprising at least one battery cell, a temperature sensor in thermal contact with the battery cell and a control unit configured to validate a temperature sensor integrated into the battery cell.

Another aspect is a method for validating a temperature sensor integrated into a battery system, comprising: determining an internal resistance of at least one battery cell in thermal contact with the temperature sensor; determining a state of charge (SOC) of the at least one battery cell; determining at least one reference temperature from a lookup table (LUT) or a functional relationship connecting the internal resistance, the SOC, and a temperature of a reference battery cell; comparing the at least one reference temperature with at least one temperature measurement of the temperature sensor to determine a difference therebetween; and validating the temperature sensor based on whether the difference exceeds a preconfigured threshold.

In the above method, the validating comprises determining that the temperature sensor functions properly when the difference does not exceed the preconfigured threshold; and determining that the temperature sensor functions improperly when the difference exceeds the preconfigured threshold.

In the above method, the determination of the internal resistance and SOC of the at least one battery cell and the at least one temperature measurement of the temperature sensor are performed during a preconfigured period of time. In the above method, the internal resistance of the at least one battery cell is determined based on a measurement of a voltage drop during a discharge pulse. In the above method, the voltage drop is measured with respect to an actual terminal voltage of the at least one battery cell and in response to a specific load or balancing current drawn from the at least one battery cell and/or a specific charging or balancing current provided to the at least one battery cell. In the above method, the internal resistance of the at least one battery cell is determined by measuring a voltage transient in response to cutting a specific load from the at least one battery cell.

In the above method, the SOC of the at least one battery cell is determined based on measuring an actual terminal voltage of the at least one battery cell. In the above method, a reference SOC value is determined based on the measured actual terminal voltage and an SOC-LUT. In the above method, the reference battery cell is of the same type as the at least one battery cell. In the above method, the LUT is based on a plurality of reference measurements of an internal resistance of the reference cell for a plurality of different SOC values and a plurality of different temperatures. In the above method, the LUT is based on an equivalent circuit model providing a parameterized function of the battery cell's internal resistance in dependence of its SOC and its temperature. In the above method, parameters of the equivalent circuit model or the parameterized function are determined by fitting the model or the parameterized function to the plurality of reference measurements.

Another aspect is a method for validating a temperature sensor integrated into a battery system, comprising: determining an internal resistance of at least one battery cell in thermal contact with the temperature sensor; determining a state of charge (SOC) of the at least one battery cell; determining at least one reference temperature from a memory or a functional relationship connecting the internal resistance, the SOC, and a temperature of a reference battery cell; and comparing the at least one reference temperature with at least one temperature measurement of the temperature sensor to determine a difference therebetween.

The above method further comprises: validating the temperature sensor based on whether the difference exceeds a preconfigured threshold. In the above method, the validating comprises: determining that the temperature sensor functions properly when the difference does not exceed the preconfigured threshold; and determining that the temperature sensor functions improperly when the difference exceeds the preconfigured threshold. In the above method, the validating comprises: determining that the temperature sensor functions properly when the difference exceeds the preconfigured threshold; and determining that the temperature sensor functions improperly when the difference does not exceed the preconfigured threshold.

Another aspect is a battery system, comprising: at least one battery cell; at least one temperature sensor in thermal contact with and configured to sense temperature of the at least one battery cell; at least one voltage sensor configured to measure a terminal voltage of the at least one battery cell; and a controller configured to i) determine an internal resistance of the at least one battery cell, ii) determine a state of charge (SOC) of the at least one battery cell, iii) determine at least one reference temperature from a lookup table (LUT) or a functional relationship connecting the internal resistance, the SOC, and a temperature of a reference battery cell, iv) compare the at least one reference temperature with at least one temperature measurement of the temperature sensor to determine a difference therebetween and v) validate the temperature sensor based on whether the difference exceeds a preconfigured threshold.

In the above battery system, the controller is further configured to: determine that the temperature sensor functions properly when the difference does not exceed the preconfigured threshold; and determine that the temperature sensor functions improperly when the difference exceeds the preconfigured threshold. The above battery system further comprises: at least one current sensor configured to measure a load, balancing and/or charging current of the battery cell, wherein the controller comprises at least one cell supervision circuit (CSC) configured to receive measurement values of the temperature, voltage and current sensors. In the above battery system, the controller further comprises a battery management system (BMS) connected to the at least one CSC, and being configured to: receive voltage, current, and temperature values from the at least one CSC; determine SOC and internal resistance of the at least one battery cell; and determine the at least one reference temperature, and compare it to the at least one temperature value received from the at least one CSC.

BRIEF DESCRIPTION OF THE DRAWINGS

Features will become apparent to those of ordinary skill in the art by describing in detail exemplary embodiments with reference to the attached drawings.

DETAILED DESCRIPTION OF EMBODIMENTS

Figure 1:
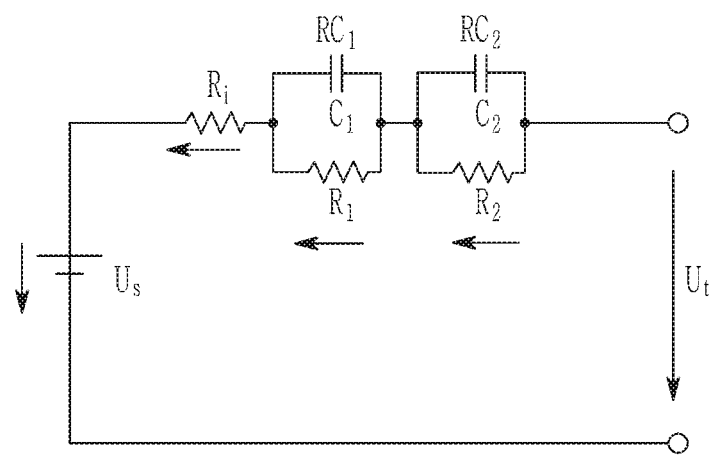
FIG. 1 illustrates an equivalent circuit of a battery cell comprising internal resistance $R_I$.

For meeting the dynamic power demands of various electrical consumers connected to the battery system, static control of battery power output and charging is not sufficient. Thus, steady exchange of information between the battery system and the controllers of the electrical consumers is required. This information includes the battery system's actual state of charge (SOC), potential electrical performance, charging ability and internal resistance as well as actual or predicted power demands or surpluses of the consumers. Battery systems usually comprise a battery management system (BMS) for processing this information.

The BMS is usually coupled to the controller of one or more electrical consumers as well as to each of the battery modules of the battery system. For controlling a plurality of battery modules by a single BMS a daisy chain setup may be used. In such setup, the BMS, as master, is connected for communication in series to a plurality of battery modules, particularly to a plurality of cell supervision circuits, CSC, of the respective battery modules. Therein, the CSC may be arranged on a printed circuit board, PCB, on top of a respective battery module.

Within the battery modules or the battery system, a plurality of sensors are utilized for determining the information on the battery cells therein. Usually at least voltage sensors, current sensors, and temperature sensors are installed in the battery modules or system. However, due to restriction of the installation space, the number of sensors that can be utilized is limited, particularly in smaller battery modules or systems. At the same time, the impact or the risk of a faulty measurement due to a malfunctioning sensor increases as the number of a certain sensor species decreases. Until now, a minimum amount of each sensor species has thus to be installed even into small systems. Then, a validation of the individual sensors can be achieved by cross comparison of their respective measurement results.

A further reduction of the number of sensors, particularly temperature sensors, in a battery system is limited. This can put additional constraints on the available construction space and keeps production costs high.

Some embodiments can overcome or reduce at least some of the above drawbacks and provide a method for validating a temperature sensor integrated into a battery system that allows for a further reduction of the amount of sensors.

Reference will now be made in detail to embodiments, examples of which are illustrated in the accompanying drawings. Effects and features of the exemplary embodiments, and implementation methods thereof will be described with reference to the accompanying drawings. In the drawings, like reference numerals denote like elements, and redundant descriptions are omitted.

The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art.

Accordingly, processes, elements, and techniques that are not considered necessary to those having ordinary skill in the art for a complete understanding of the aspects and features of the present invention may not be described. In the drawings, the relative sizes of elements, layers, and regions may be exaggerated for clarity.

As used herein, the term "and/or" includes any and all combinations of one or more of the associated listed items. Further, the use of "may" when describing embodiments of the present invention refers to "one or more embodiments of the present invention." In the following description of embodiments of the present invention, the terms of a singular form may include plural forms unless the context clearly indicates otherwise.

It will be understood that although the terms "first" and "second" are used to describe various elements, these elements should not be limited by these terms. These terms are only used to distinguish one element from another element. For example, a first element may be named a second element and, similarly, a second element may be named a first element, without departing from the scope of the present invention.

As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about" and similar terms are used as terms of approximation and not as terms of degree, and are intended to account for the inherent deviations in measured or calculated values that would be recognized by those of ordinary skill in the art.

FIG. 1 illustrates an equivalent circuit of a battery cell that can be used for deriving an LUT for a method of validating a temperature sensor integrated into a battery system. In the equivalent circuit, the battery cell is modelled in first order as a series connection of an ideal voltage source providing the source voltage $U_S$ and an internal resistance $R_I$. The equivalent circuit provides a terminal voltage $U_t$ between two external terminals of the circuit, e.g., to an external load. Therein, terminal voltage $U_t$ can be mapped to a real battery cell's terminal voltage and is smaller than the source voltage $U_S$, at least once a load is connected to the external terminals of the equivalent circuit.

In some embodiments, in the equivalent circuit of FIG. 1, additional RC elements are connected in series to the ideal voltage source and the internal resistance $R_I$. Therein, a first RC element $RC_1$ comprises a first resistance $R_1$ connected in parallel with a first capacitance $C_1$ and a second RC element $RC_2$ comprises a second resistance $R_2$ connected in parallel with a second capacitance $C_2$. The values of the second resistance $R_2$ and the second capacitance $C_2$ are smaller than the values of the first resistance $R_1$ and the first capacitance $C_1$, respectively. The RC elements $RC_1$ and $RC_2$ thus allow for a series expansion of the battery cell's impedance and thus can be a best fit of the equivalent circuit to even the non-linear performance characteristics of a real battery cell.

Figure 2:
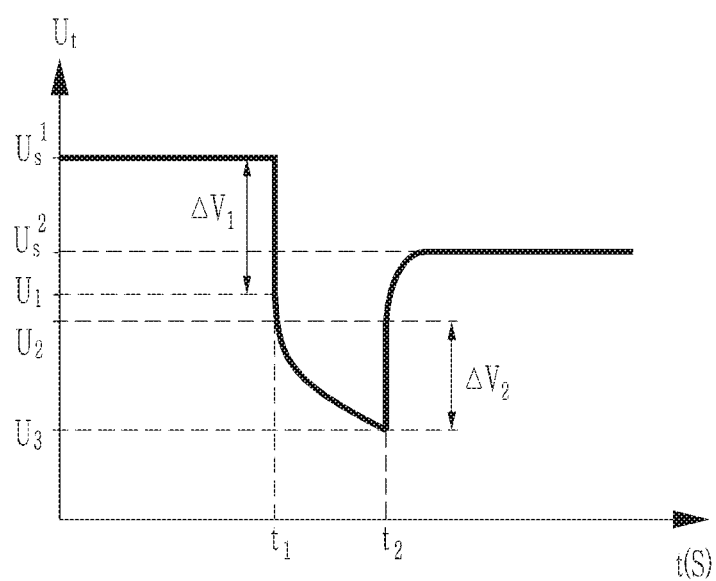
FIG. 2 illustrates a battery cell's terminal voltage in response to drawing and cutting a load current.

FIG. 2 illustrates a time series of the terminal voltage $U_t$ of the equivalent circuit of FIG. 1. Initially, no load is connected to the external terminals of the equivalent circuit and thus the terminal voltage $U_t$ of the equivalent circuit is roughly equal to a first source voltage $U_S^1$ (open circuit voltage) which corresponds to a first state of charge of the battery cell. A more detailed description of the equivalent circuit model of FIG. 1 is disclosed in Huria T et al., *High Fidelity Electrical Model with Thermal Dependence for Characterization and Simulation of High Power Lithium Battery Cells*, 978-1-4673-1561-6, 2012, the whole content of which is incorporated herein by reference.

At a time point $t_1$, an external load is connected to the external terminals of the circuit of FIG. 1. The external load draws a specific load $I_L$ current from the battery cell. As illustrated in FIG. 2, the terminal voltage $U_t$ drops with a step response almost instantaneously before decreasing further at a smaller rate until the time point $t_2$. Therein, the step response voltage drop $\Delta V_1$ of the terminal voltage is due to the voltage drop over the internal resistance $R_I$ due to the load current $I_L$. Hence, by measuring the voltage drop $\Delta V_1$ the value of the internal resistance can be determined using the value of the load current $I_L$ via Ohms law as $R_I = \Delta V_1 / I_L$. The additional non-linear decrease of the terminal voltage $U_t$ in between the time points $t_1$ and $t_2$ may be best explained by the behavior of the RC elements $RC_1$ and $RC_2$ and can be thus considered to be independent of the internal resistance's magnitude to a large extent.

At a time point $t_2$, the load is disconnected (cut) from the external terminals of the circuit of FIG. 1 and hence the load current $I_L$ is suspended. In response thereto, the terminal voltage $U_t$ of the battery cell recovers towards the open cell voltage of the battery cell. As the battery experienced an actual discharge due to the integrated drawn load current $I_L$, the terminal voltage settles at a source voltage $U_S^2$ which is smaller than the initial source voltage $U_S^1$.

Again, the step response of the voltage, this time the step response voltage increase $\Delta V_2$, is due to the internal resistance $R_I$, particularly due to the omitted voltage drop at the internal resistance after the ceasing of the load current $I_L$. Thus, also by measuring the voltage drop $\Delta V_2$, the value of the internal resistance can be determined using the value of the load current $I_L$ via Ohms law as $R_I = \Delta V_2 / I_L$. The additional non-linear increase of the terminal voltage $U_t$ after time point $t_2$ is again due to the behavior of the RC elements $RC_1$ and $RC_2$ and can be thus considered to be independent of the internal resistance's magnitude to a large extent.

Figure 3:
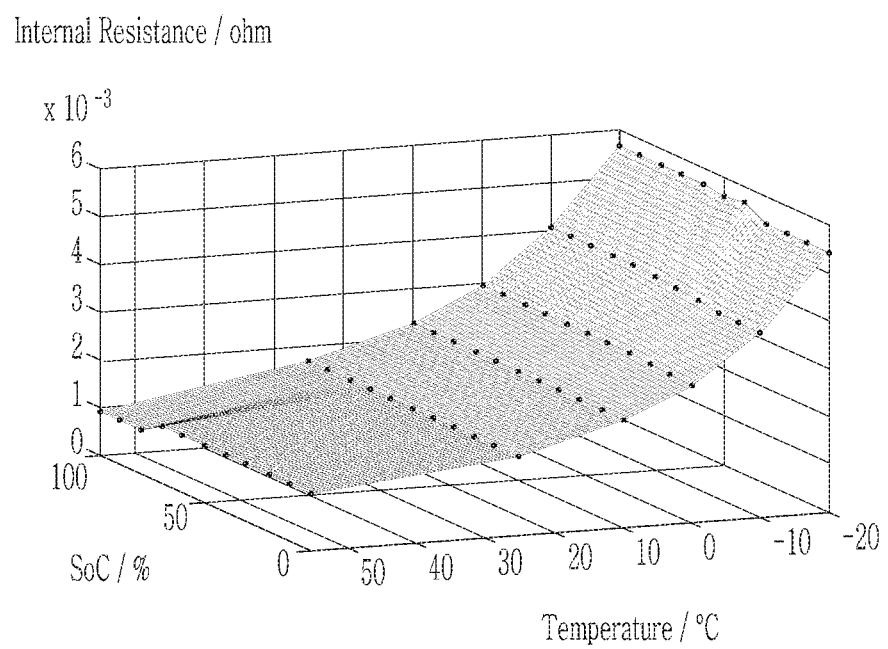
FIG. 3 illustrates the dependence of a battery cell's internal resistance $R_I$ from the battery cell's state of charge, SOC, and the battery cell's temperature.

FIG. 3 illustrates the dependence of a battery cell's internal resistance $R_I$ from the battery cell's state of charge, SOC, and of the battery cell's temperature. Therein, the illustration of FIG. 3 can be understood as a visualization or graph of a Lookup table according to some embodiments. For example, the black dots represent measurement values of a plurality of reference measurements of the battery cell's internal resistance at different temperatures and different SOCs. In some embodiments, the battery cell's internal resistance was measured at temperatures of −20° C., −10° C., 0° C., 10° C., 25° C., and 60° C. and at different states of charge from 0 to 100% in 10% increments. The obtained reference measurement values of the cell's internal resistance were then fitted to a parametrized function defining the battery cell's internal resistance as a function of its SOC and temperature in order to determine the parameters of that function. The obtained parametrized function with fitted parameters provides the continuous functional relationship $R_I = f(SOC, T)$ as illustrated in FIG. 3. This functional relationship assigns a specific value for the battery cell's internal resistance $R_I$ to each pair of the battery cell's temperature, T, and state of charge, SOC.

Figure 4:
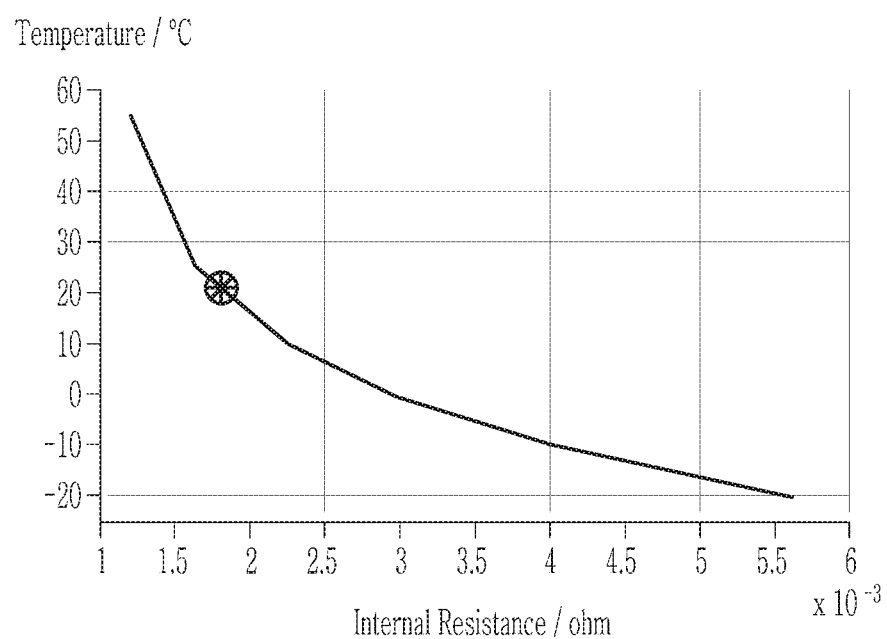
FIG. 4 illustrates the dependence of a battery cell's internal resistance $R_I$ from the battery cell's temperature at a fixed state of charge, SOC, of the battery cell.

FIG. 4 illustrates a cut through the graph in FIG. 3 at a state of charge, SOC, of 50%. The derived line graph illustrates the dependency of a battery cell's internal resistance, $R_I$, from its temperature, T, at an SOC of 50%. Hence, by determining the internal resistance of a battery cell that has been determined to have an SOC of 50%, the temperature of the battery cell can be deduced. Exemplarily, by drawing a load current from a battery cell at an SOC of 50% and by measuring the corresponding voltage step response as illustrated in FIG. 2, the battery cell's internal resistance was determined to be around 1.8 mOhm.

Then, by utilizing the section of the LUT as illustrated in FIG. 4, the reference temperature of the battery cell is determined to be around 20.5° C. This reference temperature can then be used to validate the temperature measurement of at least one temperature sensor which is in thermal contact with the battery cell. In some embodiments, if a temperature measurement obtained by the temperature sensor (during a preconfigured time period around the measurements of SOC and voltage drop $\Delta V$) lies in between 19° C. and 22° C., for example, 19.5° C. and 21.5° C., the temperature sensor is validated. If, however, the difference between the temperature measurement and the reference temperature of 20.5° C. exceeds a value of e.g., 2.5° C., or 2° C., the temperature sensor can be determined to be erroneous or at least the respective temperature measurement can be determined to be faulty. The threshold has to be defined, based on the measurement accuracy of the utilized Temperature sensor, the characteristics in the LUT and measurement accuracy of current and voltage used to determine the cell resistance. In response to such determination, the battery cell might be shut down or a notification may be output to a user of the battery cell.

Figure 5:
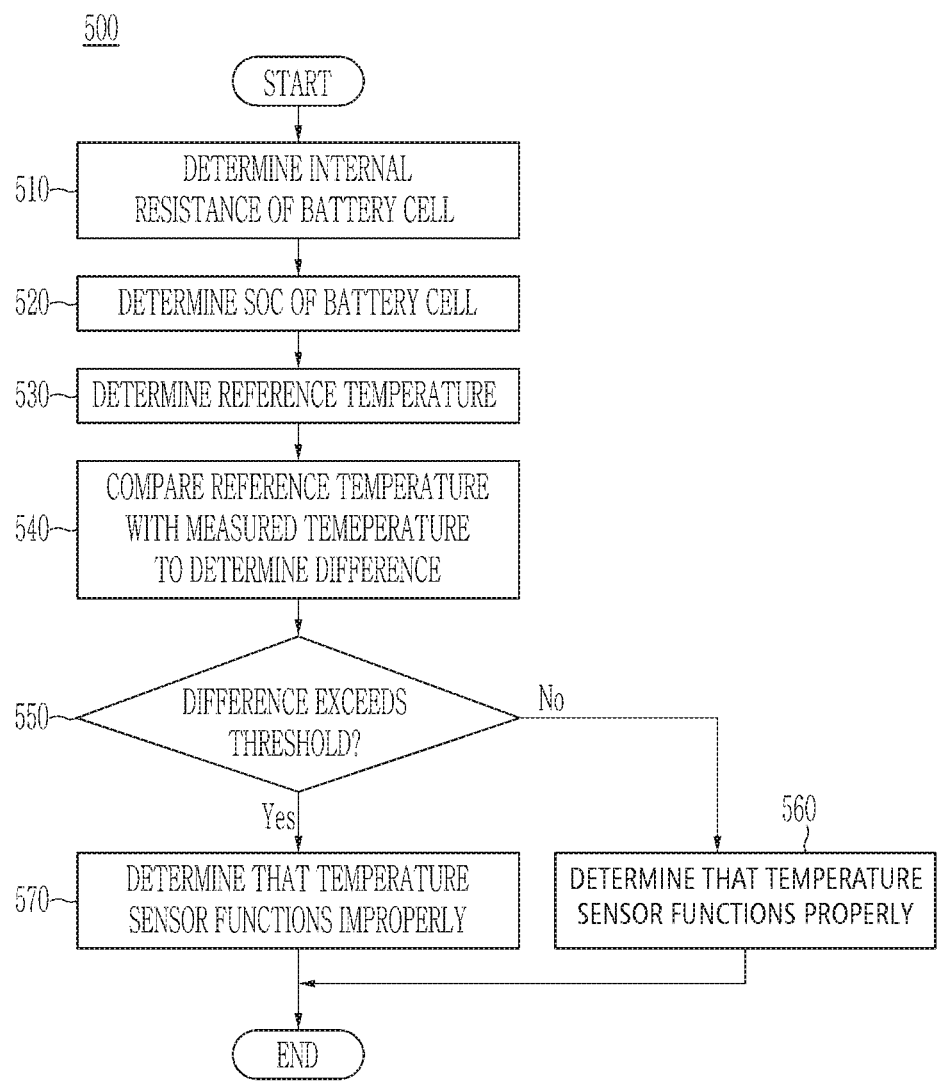
FIG. 5 illustrates a flowchart of a method or process for validating a temperature sensor integrated into a battery system according to some embodiments.

FIG. 5 illustrates a flowchart of a method or process 500 for validating a temperature sensor integrated into a battery system according to some embodiments. Although the method 500 is described herein with reference to a particular order, in various embodiments, states herein can be performed in a different order, or omitted, and additional states can be added. In state 510, an internal resistance of at least one battery cell in thermal contact with the temperature sensor is determined. In state 520, a state of charge (SOC) of the at least one battery cell is determined. In state 530, at least one reference temperature from a lookup table (LUT) or a functional relationship connecting the internal resistance, the SOC, and a temperature of a reference battery cell is determined. In state 540, the at least one reference temperature is compared with at least one temperature measurement of the temperature sensor to determine a difference therebetween. In state 550, it is determined whether the difference exceeds a reconfigured threshold. The temperature sensor can be validated based on whether the difference exceeds a preconfigured threshold. In state 560, it is determined that the temperature sensor functions properly when the difference does not exceed the preconfigured threshold in state 560. In state 570, it is determined that the temperature sensor functions improperly when the difference exceeds the preconfigured threshold in state 560. Although not shown in FIG. 5, in some embodiments, it can be determined that the temperature sensor functions properly when the difference exceeds the preconfigured threshold. In these embodiments, it can be determined that the temperature sensor functions improperly when the difference does not exceed the preconfigured threshold.

Figure 6:
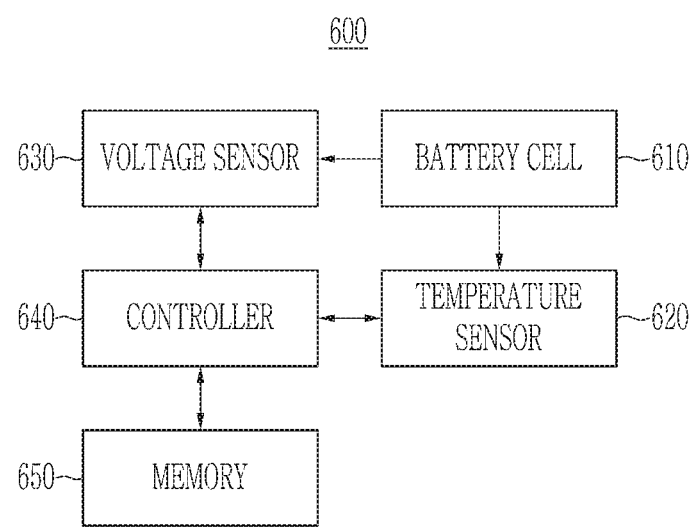
FIG. 6 illustrates a block diagram of a battery system 600 for validating a temperature sensor according to some embodiments.

FIG. 6 illustrates a block diagram of a battery system 600 for validating a temperature sensor according to some embodiments. FIG. 6 is merely an example block diagram of the battery system 600, and certain elements can be removed, other elements added, two or more elements combined or one element can be separated into multiple elements depending on the specification and requirements. The system 600 includes at least one battery cell 610, at least one temperature sensor 620, at least one voltage sensor 630, a controller 640 and a memory 650. The temperature sensor 620 is in thermal contact with and configured to sense temperature of the battery cell 610. The voltage sensor 630 is configured to measure a terminal voltage of the battery cell 610. The controller 640 is configured to determine an internal resistance of the battery cell 610 in thermal contact with the temperature sensor 620. The controller 640 is further configured to determine a state of charge (SOC) of the battery cell 610. The controller 640 is further configured to determine at least one reference temperature from a lookup table (LUT) stored in the memory 650, or a functional relationship connecting the internal resistance, the SOC, and a temperature of a reference battery cell. The controller 640 is further configured to compare the at least one reference temperature with at least one temperature measurement of the temperature sensor 620. In some embodiments, in validating the temperature sensor, the controller 640 is further configured to determine that the temperature sensor functions properly when the difference does not exceed the preconfigured threshold, and determine that the temperature sensor functions improperly when the difference exceeds the preconfigured threshold. In other embodiments, in validating the temperature sensor, the controller 640 is further configured to determine that the temperature sensor functions properly when the difference exceeds the preconfigured threshold, and determine that the temperature sensor functions improperly when the difference does not exceed the preconfigured threshold.

Another aspect is a method for validating a temperature sensor, for example, validating a measurement of a temperature sensor. In the above method, an internal resistance as well as a state of charge, SOC, of at least one battery cell, which is in thermal contact with a temperature sensor to be validated, is determined. The internal resistance $R_I$ and the SOC are key performance indicators for battery cells that are commonly determined in many available battery systems and various methods for determining the internal resistance, $R_I$, and the state of charge, SOC, of a battery cell are known to the person skilled in the art.

In the above method, at least one reference temperature is determined from a lookup table, LUT, or a functional relationship, which are connecting at least the internal resistance, the SOC, and the temperature of a reference battery cell, and connect the internal resistance, the SOC, the temperature, and the current height of a reference battery cell. In other words, the LUT or functional relationship provide a function $T=f(SOC, R_I)$, or $T=f(SOC, R_I, I)$, for the reference battery cell. The LUT or functional relationship can connect each pair of values for the internal resistance and the state of charge to exactly one value of a temperature of the reference battery cell. However, the LUT could also map a plurality of values for SOC and/or $R_I$ to the same temperature value of a reference battery cell, i.e. provide different classes of temperatures for the reference battery cell. Further preferred, values for the SOC and the $R_I$ are determined for a plurality of battery cells in thermal contact with the temperature sensor and a plurality of reference temperatures, one for each cell, is determined from the LUT or functional relationship. Particularly preferred, the reference battery cell is of the same type as the at least one battery cell in thermal contact with the temperature sensor to be validated.

In the above method, the at least one reference temperature is finally compared with a temperature measurement of the temperature sensor to be validated. Based on the result of this comparison, the temperature sensor or the temperature measurement of the temperature sensor can be validated. The method allows validating even a single temperature sensor by utilizing the characteristic values of SOC and internal resistance, and also the current height, that are already obtained in many battery systems. This is enabled by the LUT or functional relationship linking the values of the SOC and internal resistance of a battery cell to the temperature of a reference battery cell. Thus, a reference temperature for the battery cell is derived from the values of SOC and internal resistance.

In the above method, a difference between the at least one reference temperature and the temperature measurement of the temperature sensor is determined. In the above method, differences between each of a plurality of reference temperatures, each obtained for one of a plurality of battery cells in thermal contact with the temperature sensor, and a temperature measurement of the temperature sensor are determined. Furthermore, multiple temperature measurements are utilized for comparison with one or more reference temperatures, in the form of individual values or of mean values.

The obtained one or more (temperature) differences, i.e., ΔT, are compared to a preconfigured threshold and the at least one battery cell is validated based on whether the obtained one or more (temperature) differences exceeds the preconfigured threshold. For example, if the temperature difference(s) is/are to be smaller than the preconfigured threshold, the temperature sensor is determined to function properly and if the temperature difference(s) exceed(s) the preconfigured threshold the temperature sensor is determined to function improperly. In some embodiments, a control signal is outputted if the temperature difference exceeds the preconfigured threshold. In other embodiments, the control signal is outputted from a control unit (or controller), e.g., of a battery system, performing the above method.

In the above method, the control signal is further processed in the control unit of a battery system comprising the battery cell or of a load apparatus connected to the battery system. In some embodiments, in response to the control signal a notification to a user is outputted, e.g., via a graphical user interface, GUI, or other human machine interface, HMI, of, e.g., the battery system or load apparatus. In other embodiments, in response to the control signal, a flag is set in a data structure marking the validated temperature sensor to be functional or non-functional. No further measures as described before may be initiated if the flag is set only sporadically.

In the above method, determining the internal resistance, determining the state of charge of the at least one battery cell and the temperature measurement of the temperature sensor are all performed during a preconfigured period of time. Thus, the comparability of the temperature measurement and the reference temperature obtained by the LUT or functional relationship may be increased. The preconfigured period of time may be less than 30 s, less than 15 s, less than 10 s, less than 5 s, or less than 1 s.

The comparability of reference temperature(s) and temperature measurement(s) is further increased by improving the thermal contact between the temperature sensor and the at least one battery cell. Various methods for increasing thermal contact, e.g., by ensuring sufficient mechanical contact with a spring loaded measuring head or using heat-conducting paste, are known to the person skilled in the art. Further preferred, reference temperatures obtained from the LUT or functional relationship using the SOC and the internal resistance of a specific battery cell are used only for validation of temperature sensor(s) that is (are) intended for performing temperature measurements of that specific battery cell.

In the above method, the internal resistance of a battery cell refers to the resistance of a virtual impedance which is considered to be connected in series with an ideal voltage source in an equivalent circuit model of the battery cell. The internal resistance of the at least one battery cell can be determined using any method known to the skilled person. In the above method, the internal resistance of at least one battery cell is determined by measuring a voltage drop of the battery cell during a charging or discharge pulse of the battery cell. While the battery cell delivers a current to a load, i.e., during a discharge pulse, or while a current is provided to the battery cell, i.e., during a charging pulse, a measured voltage output of the battery cell is less than the open-circuit voltage, OCV, of the battery cell. As this voltage drop is the product of internal resistance and the drawn or provided current, the internal resistance can be calculated using the known value of the drawn or provided current. In order to disregard the actual drop of the OCV due to discharge or charge of the battery cell, for example, a short discharge pulse or charge pulse is less than 30 s, for example, less than 20 s, 10 s, 5 s, or 1 s. Alternatively, the voltage drop of the battery cell is measured during a balancing current is drawn from or provided to the battery cell. Such balancing current may be usually a well-defined current.

In the above method, the voltage drop is measured with respect to an actual terminal voltage of the at least one battery cell and in response to a specific load current drawn from the at least one battery cell. Therein, an actual terminal voltage is determined by initially measuring the cell's open-circuit voltage at the beginning of the step of determining the internal resistance of the at least one battery cell.

Further, a well-defined load current is drawn from the at least one battery cell or the drawn load current is measured using at least one current sensor, e.g., a shunt resistor with well-defined ohmic resistance. As the load current is drawn, the voltage drop is determined as the step response of the battery's terminal voltage with respect to the initially measured open circuit voltage. Alternatively, the voltage drop over a load with ohmic resistance is used for determining the internal resistance of a battery cell using the OCV of the cell.

In the above method, the internal resistance of at least one battery cell is determined by measuring a voltage transient in response to cutting a specific load from the at least one battery cell. Due to the discharge of the battery cell in response to the load current, the battery cell's voltage will return to another OCV than the initially measured OCV. The voltage transient is thus determined as the step response of the voltage after cutting the load. Therein, in a graph of the voltage over time, the step response refers to an essential vertical portion of the graph. In other words, the voltage transient is the absolute value of the voltage difference between (i) the terminal voltage just before the load was cut and (ii) the terminal voltage at which the rate of change of the voltage can again be resolved.

In the above method, the state of charge, SOC, refers to the actual charging state of a battery cell relative to the battery's maximal capacity. Various methods for determining a battery cell's state of charge are known to the person skilled in the art and, in principal, each of these methods can be employed in the above method. Therein, the measurement method may depend on the actual battery type, e.g., whether the cell is a lithium ion, Li-ion, battery cell or a nickel-metal hydride, NiMH, battery cell. The SOC of the at least one battery cell can be determined based on at least one of: coulomb counting (current integration method), a voltage based method, impedance spectroscopy, chemical methods (e.g., hydrometer based methods), pressure-based methods (only for NiMH batteries), Kalman filtering, or by a combination of the aforementioned methods.

In the above method, the SOC of the at least one battery cell is determined based on measuring an actual terminal voltage of the at least one battery cell. deterioration of the terminal voltage in dependence of the state of charge may be known for the at least one battery cell. Thus, from a measurement of the actual terminal voltage the SOC can be derived via an OC-LUT or an SOC functional relationship that connect an actual terminal voltage to an SOC value. An SOC-LUT can be utilized for determining a reference SOC based on a measurement of the actual terminal voltage.

In the above method, the SOC-LUT or SOC functional relationship is obtained from a plurality of reference measurements of a reference battery cell of the same type as the at least one battery cell and/or an equivalent circuit model of the at least one battery cell. In the reference measurements the terminal voltage is measured for a plurality of known SOCs, wherein the SOC of the reference cell may be determined by any of the methods mentioned above. The reference measurements may be combined with an equivalent circuit model of the at least one battery cell providing one or more equations or a parametrized function relating the SOC of the battery cell to its actual terminal voltage. Therein, the equations may be solved numerically and/or the parameters of the function may be fitted based on the reference measurements. In a control unit performing the above method, either an SOC-LUT or a parametrized function with fitted parameters is stored and utilized for determining SOC from the actual terminal voltage with low computational effort. In this embodiment, the measurement of an actual terminal voltage may be utilized for determining the SOC and the internal resistance of the cell.

In the above method, the LUT or functional relationship utilized in the above method is obtained for a reference battery cell that is of the same type as the at least one battery cell in thermal contact with the temperature sensor to be validated. The LUT is determined in a test stand during development of the battery cells. The LUT can be based on a plurality of reference measurements of an internal resistance of the reference cell that are obtained at a plurality of different temperatures of the reference battery cell and for a plurality of different SOC values of the reference battery cell. For determining the SOC and the internal resistance of the reference battery cell, any method known to the person skilled in the art can be used. For example, the methods mentioned above can be used. The LUT is then stored as a data field on a suitable data structure, e.g., in the CSC/BMS of one or more battery modules/systems with battery cells corresponding to the reference battery cell.

In the above method, the LUT or functional relationship is based on an equivalent circuit model of the at least one battery cell. An example of such an equivalent circuit model is described in Huria T et al., *High Fidelity Electrical Model with Thermal Dependence for Characterization and Simulation of High Power Lithium Battery Cells*, 978-1-4673-1561-6, 2012, the whole content of which is incorporated herein by reference. A set of equations and/or a parametrized function, which are connecting the SOC, the internal resistance, and the temperature of the at least one battery cell may be derived from such equivalent circuit model. Therein, the set of equations and/or the parametrized function define the battery cell's internal resistance as a function of its SOC and temperature or vice versa, i.e. provide at least one of the functional relationships $R_I=f(SOC, T)$, $T=f(SOC, R_I)$, and $SOC=f(R_I, T)$, and further preferred at least one of the functional relationships $R_I=f(SOC, T, I)$, $T=f(SOC, R_I, I)$, and $SOC=f(R_I, T, I)$.

During development of the at least one battery cell or a battery module or battery system with such cell, the equation(s) may be solved numerically and/or the parameters of the parametrized function may be fitted to the plurality of reference measurements as described above. Additionally, each of the aforementioned functions may further depend on one or more further characteristic values of a battery cell. Then, the respective function may also be fitted to a reference battery cell based on measurements of this one or more further characteristic values during development or testing. In a control unit performing the above method, either an LUT, i.e., an extensive data field, or a parametrized function with fitted parameters is stored and utilized for determining the temperature of the at least one battery cell based on a determined SOC and internal resistance with minimal computational effort.

In the above method, in determining the LUT or the functional relationship (parametrized function with fitted parameters) of the reference battery cell such an equivalent circuit model of the reference battery cell is combined with a plurality of reference measurements of an internal resistance of the reference battery cell, which are obtained at a plurality of different temperatures and for a plurality of different SOC values of the reference battery cell. Therein, the parameters of the parametrized function are determined (fitted) by fitting the parametrized function to the values obtained by such a plurality of reference measurements. The number of required reference measurements can thus be minimized. Special care has to be taken, that all specific characteristics of the used electrochemical energy storage device are well represented in the LUT.

By combining an equivalent circuit model and a plurality of reference measurements a continuous LUT or a functional relationship (parametrized function with fitted parameters) can be determined connecting a reference temperature to any combination of SOC and internal resistance of a battery cell. In some embodiments, the functional relationship refers to a fitted parametrized function connecting a reference temperature to any combination of SOC and internal resistance of a battery cell. Hence, a control unit performing the above method may not contain a vast amount of data triples (T, SOC, $R_I$) but may solely contain such functional relationship for deriving one value of such data triple based on the knowledge of the remaining two values.

Another aspect is a battery system that comprises at least one battery cell and at least one temperature sensor which is in thermal contact with the at least one battery cell. The battery system further comprises at least one voltage sensor for measuring a terminal voltage of the at least one battery cell and a control unit that is configured for performing the above method as described above. The temperature sensor may comprise a thermistor, e.g., a negative temperature coefficient, NTC, which is in thermal contact with the battery cell of the battery module. However, any other kind of temperature sensor that outputs the temperature measurement as electronic signal can be used as well. The voltage sensor may be a Hall probe, another suitable voltage sensor or measurement circuit.

In the above battery system, the control unit is configured to receive temperature measurements from the at least one temperature sensor and terminal voltage measurements of the at least one voltage sensor. In some embodiments, the control unit is configured to determine the SOC and the internal resistance of the at least one battery cell utilizing the received voltage measurements. Therefore, the control unit comprises a memory storing an SOC-LUT that is relating the SOC of a reference battery cell to its actual terminal voltage. Further, the control unit is configured to draw a well-defined load current from the battery cell, for providing a well-defined charging current to the battery cell or for drawing/providing a well-defined balancing current from/to the battery cell, for measuring a voltage drop of the terminal voltage of the cell during the load current, charging current or balancing current is drawn or provided, and for calculating an internal resistance from the load, charging, or balancing current and the terminal voltage drop. The control unit also comprises a memory storing a LUT relating the SOC and the internal resistance of the at least one battery cell with the actual temperature of a reference battery cell and is further configured to determine a reference temperature for the at least one battery cell utilizing the SOC and internal resistance of the at least one battery cell and the LUT. In the above battery system, a characteristic current (within some margin) is used for the resistance determination. The current height should be predefined, depending on the application area of the monitored battery.

The above battery system comprises at least one battery module with a plurality of aligned battery cells connected in series and/or in parallel between module terminals of the battery module. At least one temperature sensor is in thermal contact with at least one battery cell of the battery module. Further, at least one voltage sensor is configured to measure a terminal voltage of a battery cell of the battery module and at least one current sensor is configured to measure a load current of this battery cell of the battery module. In some embodiments, the control unit comprises at least one cell supervision circuit, CSC, that is connected to one of the at least one battery module. In some embodiments, the CSC is disposed on a (flexible) PCB that is mechanically connected to the battery module, e.g., to a top surface or a side surface of the battery module. The CSC is configured to receive measurement values of the sensors, i.e., of the at least one temperature sensor, at least one voltage sensor, and at least one current sensor of that battery module that is connected to the CSC. At least some of the sensors or sensor components may be formed as a part of the CSC and/or disposed on the (flexible) PCB.

In the above battery system, the control unit of the battery system also comprises a battery management system, BMS, which is connected to at least one CSC. The above battery system comprises a plurality of battery modules, a plurality of CSCs connected thereto, and a BMS connected to the plurality of CSCs. The BMS may be connected to the plurality of CSCs in a daisy chain configuration or via a suitable communication bus, such as a CAN bus. The BMS may be further configured to communicate data with the CSCs as well as with electrical consumers located outside the battery system and connected to the battery system.

In the above battery system, the BMS is configured to receive voltage measurement, current measurement, and temperature measurement values from the at least one connected CSC. Based on these received measurement values, the BMS determines SOC and internal resistance of at least one battery cell of the battery module connected to the at least one CSC from which at least the voltage and current values originate. Therefore, the BMS comprises and utilizes a memory storing an SOC-LUT relating the SOC of a reference battery cell to its actual terminal voltage. In some embodiments, the BMS is configured to calculate an internal resistance from the received current and voltage measurements. The BMS is also configured to determine at least one reference temperature based on the determined SOC and internal resistance of the at least one battery cell. Therefore, the BMS comprises a memory storing a LUT relating the determined SOC and internal resistance with the temperature of a reference battery cell.

In the above battery system, the BMS is finally configured to compare the determined at least one reference temperature to the at least one received temperature value and for outputting a control signal based on whether or not a difference between the at least one measured temperature and the at least one determined reference temperature exceeds a preconfigured threshold. In this embodiment, the measurement tasks and the computing tasks are distributed in the battery system. In some embodiments, storage of the LUTs may be only required within the BMS.

The electronic or electric devices and/or any other relevant devices or components according to embodiments described herein, except those described explicitly as hardware, may be implemented utilizing any suitable hardware, firmware (e.g., an application-specific integrated circuit), software, or a combination of software, firmware, and hardware. For example, the various components of these devices may be formed on one integrated circuit (IC) chip or on separate IC chips.

Further, the various components of these devices may be implemented on a flexible printed circuit film, a tape carrier package (TCP), a printed circuit board (PCB), or formed on one substrate. The electrical connections or interconnections described herein may be realized by wires or conducting elements, e.g., on a PCB or another kind of circuit carrier. The conducting elements may comprise metallization, e.g., surface metallizations and/or pins, and/or may comprise conductive polymers or ceramics. Further electrical energy might be transmitted via wireless connections, e.g., using electromagnetic radiation and/or light.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like.

Also, a person of skill in the art should recognize that the functionality of various computing devices may be combined or integrated into a single computing device, or the functionality of a particular computing device may be distributed across one or more other computing devices without departing from the scope of the embodiments of the present invention.

What is claimed is:

1. A method for validating a temperature sensor integrated into a battery system, comprising:
    determining an internal resistance of at least one battery cell in thermal contact with the temperature sensor;
    determining a state of charge (SOC) of the at least one battery cell;
    determining at least one reference temperature from a lookup table (LUT) or a parametrized function that defines one of the following three parameters: the internal resistance, the SOC, and a temperature of a reference battery cell, based on the other two parameters, the reference temperature being indicative of a temperature of the at least one battery cell;
    comparing the at least one reference temperature with at least one temperature measurement of the temperature of the at least one battery cell using the temperature sensor to determine a difference therebetween;
    determining whether the temperature sensor is functioning properly based on whether the difference exceeds a preconfigured threshold, wherein the preconfigured threshold is defined based on a measurement accuracy of current and voltage used to determine the internal resistance of the at least one battery cell; and
    in response to determining that the temperature sensor is not functioning properly, shutting down the at least one battery cell or outputting a notification to a user of the at least one battery cell, and wherein the LUT or the parametrized function is obtained by:
- obtaining a plurality of reference measurements of an internal resistance of the reference battery cell for a plurality of different SOC values and a plurality of different temperatures;
- combining an equivalent circuit model of the reference battery cell with the plurality of reference measurements;
- deriving the parametrized function connecting the SOC, the internal resistance and the temperature of the at least one battery cell from the equivalent circuit model; and
- fitting parameters of the parametrized function to the plurality of reference measurements to obtain a fitted parametrized function connecting the at least one reference temperature to any combination of an SOC and internal resistance of the at least one battery cell so as to provide the LUT or the parametrized function with fitted parameters.

2. The method of claim 1, wherein the determination of the internal resistance and SOC of the at least one battery cell and the at least one temperature measurement of the temperature sensor are performed during a preconfigured period of time.

3. The method of claim 1, wherein the internal resistance of the at least one battery cell is determined based on a measurement of a voltage drop during a discharge pulse.

4. The method of claim 3, wherein the voltage drop is measured with respect to an actual terminal voltage of the at least one battery cell and in response to a specific load or balancing current drawn from the at least one battery cell and/or a specific charging or balancing current provided to the at least one battery cell.

5. The method of claim 1, wherein the internal resistance of the at least one battery cell is determined by measuring a voltage transient in response to cutting a specific load from the at least one battery cell.

6. The method of claim 1, wherein the SOC of the at least one battery cell is determined based on measuring an actual terminal voltage of the at least one battery cell.

7. The method of claim 6, wherein a reference SOC value is determined based on the measured actual terminal voltage and an SOC-LUT.

8. The method of claim 1, wherein the reference battery cell is of the same type as the at least one battery cell.

9. The method of claim 1, wherein the preconfigured threshold is further defined based on a measurement accuracy of the temperature sensor.

10. The method of claim 1, further comprising determining the temperature sensor is not functioning properly when the preconfigured threshold is 2° C. or larger.

11. The method of claim 1, wherein the preconfigured threshold is further defined based on characteristics in the LUT.

12. A battery system, comprising:
- at least one battery cell;
- at least one temperature sensor in thermal contact with and configured to sense a temperature of the at least one battery cell;
- at least one voltage sensor configured to measure a terminal voltage of the at least one battery cell; and
- a controller configured to i) determine an internal resistance of the at least one battery cell, ii) determine a state of charge (SOC) of the at least one battery cell, iii) determine at least one reference temperature from a lookup table (LUT) or a parametrized function that defines one of the following three parameters: the internal resistance, the SOC, and a temperature of a reference battery cell, based on the other two parameters, the reference temperature being indicative of a temperature of the at least one battery cell, iv) compare the at least one reference temperature with at least one temperature measurement of the temperature of the at least one battery cell using the temperature sensor to determine a difference therebetween, v) determine whether the temperature sensor is functioning properly based on whether the difference exceeds a preconfigured threshold, wherein the preconfigured threshold is defined based on a measurement accuracy of current and voltage used to determine the internal resistance of the at least one battery cell, and vi) in response to determining that the temperature sensor is not functioning properly, shut down the at least one battery cell or output a notification to a user of the at least one battery cell, and wherein the controller is configured to obtain the LUT or the parametrized function by:
- obtaining a plurality of reference measurements of an internal resistance of the reference battery cell for a plurality of different SOC values and a plurality of different temperatures;
- combining an equivalent circuit model of the reference battery cell with the plurality of reference measurements;
- deriving the parametrized function connecting the SOC, the internal resistance and the temperature of the at least one battery cell from the equivalent circuit model; and
- fitting parameters of the parametrized function to the plurality of reference measurements to obtain a fitted parametrized function connecting the at least one reference temperature to any combination of an SOC and internal resistance of the at least one battery cell so as to provide the LUT or the parametrized function with fitted parameters.

13. The battery system of claim 12, further comprising:
at least one current sensor configured to measure a load, balancing and/or charging current of the battery cell,
wherein the controller comprises at least one cell supervision circuit (CSC) configured to receive measurement values of the temperature, voltage and current sensors.

14. The battery system of claim 13, wherein the controller further comprises a battery management system (BMS) connected to the at least one CSC, and being configured to:
- receive voltage, current, and temperature values from the at least one CSC;
- determine SOC and internal resistance of the at least one battery cell; and
- determine the at least one reference temperature, and compare it to the at least one temperature value received from the at least one CSC.

* * * * *